(12) United States Patent
Cheng et al.

(10) Patent No.: US 10,484,249 B1
(45) Date of Patent: Nov. 19, 2019

(54) DYNAMIC DISTRIBUTION OF SIMULATION LOAD

(71) Applicant: Amazon Technologies, Inc., Seattle, WA (US)

(72) Inventors: Pablo Puo Hen Cheng, Pomona, CA (US); Jesse Aaron Van Beurden, Irvine, CA (US); Rosen Ognyanov Baklov, Lake Forest, CA (US); Igor Gorelik, Irvine, CA (US)

(73) Assignee: Amazon Technologies, Inc., Seattle, WA (US)

( * ) Notice: Subject to any disclaimer, the term of this patent is extended or adjusted under 35 U.S.C. 154(b) by 399 days.

(21) Appl. No.: 14/859,186

(22) Filed: Sep. 18, 2015

(51) Int. Cl.
| | | |
|---|---|---|
| *H04L 12/24* | (2006.01) | |
| *H04L 29/08* | (2006.01) | |
| *G06F 17/50* | (2006.01) | |
| *A63F 13/352* | (2014.01) | |

(52) U.S. Cl.
CPC ........ *H04L 41/145* (2013.01); *G06F 17/5009* (2013.01); *H04L 67/1008* (2013.01); *A63F 13/352* (2014.09)

(58) Field of Classification Search
None
See application file for complete search history.

(56) References Cited

U.S. PATENT DOCUMENTS

| | | | | |
|---|---|---|---|---|
| 8,271,651 B1 * | 9/2012 | Wang | ............... | H04L 67/303 709/219 |
| 9,229,657 B1 * | 1/2016 | Rus | ............... | G06F 3/0643 |
| 9,501,915 B1 * | 11/2016 | Laska | ............... | G08B 13/19606 |
| 2002/0095403 A1 | 7/2002 | Chandrasekaren et al. | | |
| 2002/0095454 A1 | 7/2002 | Reed et al. | | |
| 2003/0115434 A1 | 6/2003 | Mahalingam et al. | | |
| 2003/0177187 A1 | 9/2003 | Levine et al. | | |
| 2004/0103182 A1 | 5/2004 | Krabel et al. | | |
| 2004/0117345 A1 | 6/2004 | Bamford et al. | | |
| 2004/0117377 A1 | 6/2004 | Moser et al. | | |
| 2005/0060275 A1 | 3/2005 | Steuernagel et al. | | |
| 2005/0278731 A1 | 12/2005 | Cameron et al. | | |
| 2006/0069702 A1 | 3/2006 | Moeller et al. | | |
| 2006/0149516 A1 * | 7/2006 | Bond | ............... | A63F 13/10 703/6 |
| 2006/0265554 A1 | 11/2006 | Carter et al. | | |
| 2007/0097959 A1 | 5/2007 | Taylor | | |
| 2007/0149216 A1 | 6/2007 | Misikangas | | |
| 2008/0033812 A1 | 2/2008 | McKenna et al. | | |
| 2008/0168390 A1 * | 7/2008 | Benyamin | ............... | G06F 17/30743 715/810 |

(Continued)

*Primary Examiner* — Aaron N Strange
*Assistant Examiner* — Mohammad Yousuf A. Mian
(74) *Attorney, Agent, or Firm* — BakerHostetler

(57) ABSTRACT

Techniques for distributing processing loads in a multi-node computing environment are described. Ownership of objects of a simulation scenario is assigned to a plurality of computing nodes based on a processing load distribution associated with the simulation scenario. The simulation scenario is executed on the plurality of computing nodes, and processing loads on the computing nodes are monitored. When a processing load of one of the computing nodes has reached a threshold, objects allocated to the one node are reassigned based on properties of a subset of the objects of the simulation scenario. The properties are based on a measure of interaction between the objects in the subset.

20 Claims, 8 Drawing Sheets

(56) References Cited

U.S. PATENT DOCUMENTS

| | | |
|---|---|---|
| 2009/0254601 A1 | 10/2009 | Moeller et al. |
| 2010/0235409 A1 | 9/2010 | Roy et al. |
| 2011/0055210 A1 | 3/2011 | Meredith et al. |
| 2011/0126131 A1* | 5/2011 | Baszucki ............... G06F 3/011 715/757 |
| 2011/0161451 A1 | 6/2011 | Hum et al. |
| 2011/0191628 A1 | 8/2011 | Noguchi et al. |
| 2013/0044106 A1 | 2/2013 | Shuster et al. |
| 2013/0121263 A1 | 5/2013 | Nguyen et al. |
| 2013/0283146 A1 | 10/2013 | Barak et al. |
| 2013/0346572 A1 | 12/2013 | Jain et al. |
| 2014/0228115 A1* | 8/2014 | Kaplan ............... G06F 17/5009 463/31 |
| 2014/0359230 A1 | 12/2014 | Arora et al. |
| 2015/0382059 A1* | 12/2015 | Mano ................... H04N 9/3188 348/441 |

* cited by examiner

DYNAMIC DISTRIBUTION OF SIMULATION LOAD

BACKGROUND

In recent years, the use of electronically presented content has become increasingly popular and widespread. In some examples, certain electronically presented content, such as multi-player games, involve highly complex scenarios requiring significant computational resources. For example, a multi-player game may involve the simulation of a complex three-dimensional world with thousands of objects that must be simulated and rendered. Such complex scenarios may be implemented in a multi-node computing environment in order to distribute the computational tasks for more efficient and responsive processing. However, the distribution of computational tasks in a multi-node computing environment may change over time as simulation tasks evolve and change during the course of execution. When simulation tasks change, processing of the tasks can become inefficient as loads become imbalanced.

BRIEF DESCRIPTION OF DRAWINGS

The following detailed description may be better understood when read in conjunction with the appended drawings. For the purposes of illustration, there are shown in the drawings example embodiments of various aspects of the disclosure; however, the invention is not limited to the specific methods and instrumentalities disclosed.

DETAILED DESCRIPTION

Figure 1:
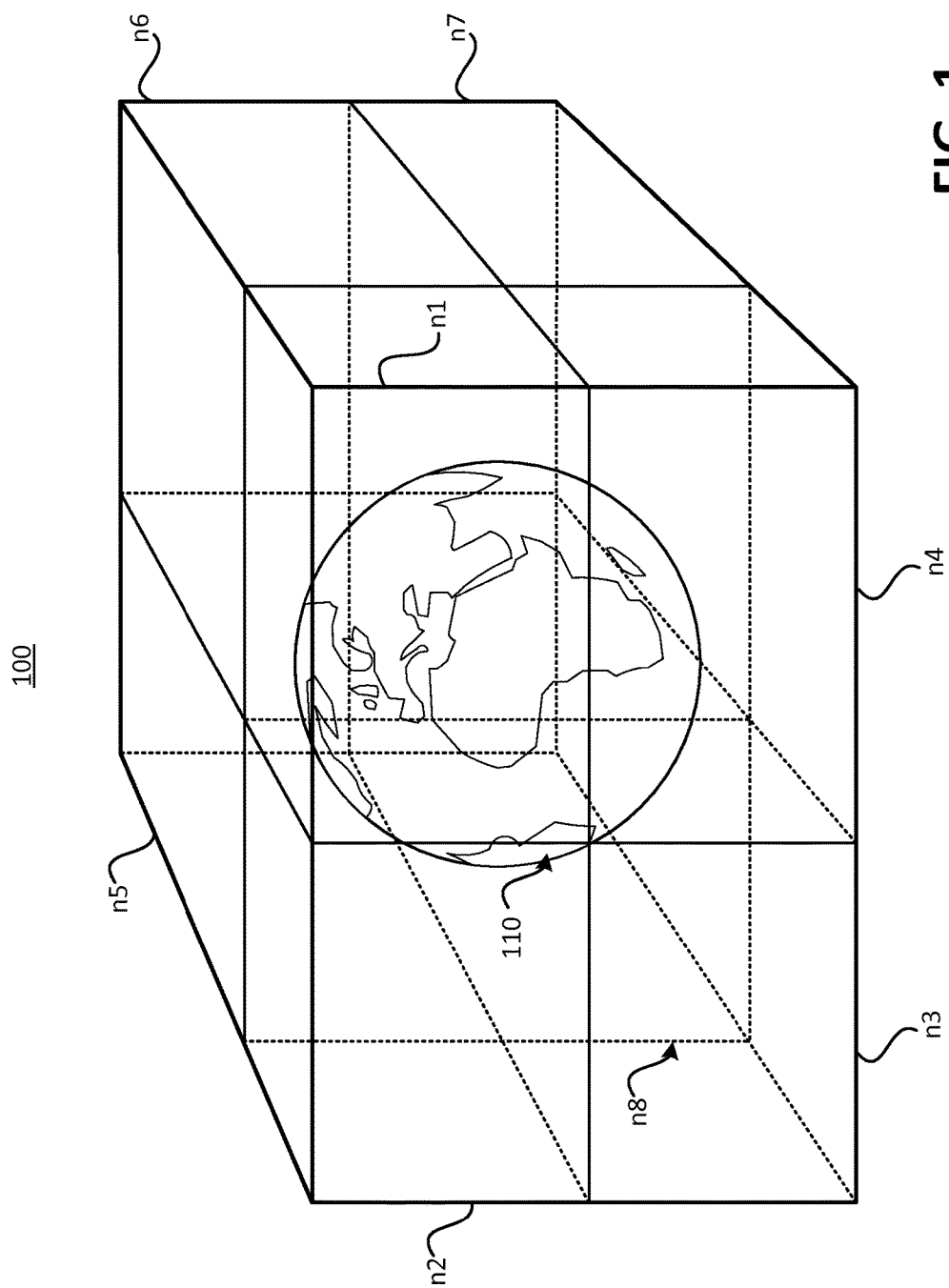
FIG. 1 is a diagram illustrating an example three-dimensional simulation and assignment of regions to nodes.

Techniques for efficient grouping of real-time simulation tasks in a multiple computing node environment are described herein. In some implementations, mechanisms for forming groupings of simulated objects are used to identify ways to allocate the groupings to the computing nodes to allow for efficient load balancing among the computing nodes. This can allow the computing environment to provide stable simulations without jitter and other problems due to processing imbalances such as overloading, or inefficient processor utilization.

Physics simulation is one of the most computationally expensive tasks encountered today in complex computing scenarios such as multi-player gaming. When a simulated multi-dimensional environment is implemented, simulation responsibilities may be divided and the divisions of the multi-dimensional environment may be distributed to the nodes of a multi-node system for parallel processing. Since multiple nodes may need to keep track of objects in the multi-dimensional environment, simulated objects of the multi-dimensional environment are typically processed by a master node and replicated across other nodes of the multi-node system. The simulated objects may include, for example, vehicles (e.g., cars, planes, etc.), projectiles, animals, other objects of nature (e.g., clouds, storm systems, etc.) that may exist in a simulated environment and that can be simulated using a physics engine or other simulation program. Nodes may keep track of the replicated objects by receiving information about the movement of the simulated objects from the master node. The replicated objects may be regularly synchronized with respect to position, orientation, linear and angular velocity, etc. based on the information from the master node, thus allowing for each node to maintain a synchronized model of the multi-dimensional environment.

In the example of a simulation scenario that includes a large-scale multiplayer action video game, the game scenario may include a vast simulated universe that employs the simulation of multiple worlds, characters, and interacting objects that may be implemented across multiple computing nodes. During the course of play, large numbers of objects (e.g., vehicles, projectiles, animals, other elements of nature, etc.) may be created, destroyed, moved, and interact, all of which may be tracked and simulated by the computing nodes. Many objects may move across computing node boundaries during the course of play, resulting in a significant amount of data that may be transmitted between the computing nodes as simulation responsibility for the objects are transferred between computing nodes. Accordingly, a significant amount of jitter may result from the continuous delays resulting from the numerous transfers.

A computing node that has simulation authority over an object is responsible for generating the simulation parameters for the object that will be sent to other computing nodes for use in tracking replicas of the object.

The ability to scale the simulation tasks to large numbers of nodes such as servers is important to the continued growth of multi-node applications such as multi-player games. Based on the nature of physics engines and their operation, one preferred way to distribute computational tasks across multiple nodes for a simulated world is to use a spatial subdivision. While one solution is to divide the simulated world into equally sized volumes, this may result in wasted computational resources. In many cases some volumes may end up generating a high computational load, resulting in computational delays and thus delays and jitter.

However, it is still desirable to distribute simulation responsibilities to the computing nodes of the multi-node system in order to better distribute processing load. In this way, simulations of objects may be performed by computing nodes having regions that are more proximate to the simulated objects. The results of the local simulations may be merged or combined by a master node and the synchronized results may be sent to the individual computing nodes. However, as objects in the multi-dimensional scenario interact and move relative to space, some regions may collect larger numbers of actively simulated objects. In some cases large numbers of such objects may end up in one volume, generating a significant computational load for the computing node responsible for that volume. The high computational load may result in delayed processing of the simulation tasks, resulting in delays in generating outputs from that node.

Such delays can result in jitter, which may generally be defined as any deviation from the expected refresh rate of graphics being generated by the multi-node network. Jitter may be observed in characteristics such as the frequency of successive pulses, the signal amplitude, or phase of periodic signals. The amount of jitter may vary depending on the network conditions and physics simulation parameters, but such jitter will typically result in graphics artifacts that generate undesirable video deficiencies for end users. For example, when an object, such as a projectile, is moving across the screen and encounters jitter, the user may perceive that the projectile has jumped from one location to another, rather than smoothly following the natural path of motion. As another example, a user may select a command that should cause movement of an object on the user's screen. However, due to jitter it may appear to the user that the user has not properly selected the command, in which case the user may repeat the selection action, causing undesired effects.

Accordingly, it would be desirable to implement a dynamic and adaptable schema to divide the simulation tasks in a multi-node environment. In one embodiment, based on the nature of physics simulations, it can be observed that a large portion of processing loads during simulation occurs while processing simulation islands. In some simulation scenarios, a group of interacting objects may be referred to as a simulation island. A simulation island may be a group of actively simulated objects that are interacting with each other. Additionally, many network issues such as jitter and lag may occur between interacting objects within a simulation island due to the high level of interaction among the objects in a simulation island, which is exacerbated when simulation responsibility for an island is split between two computing nodes. Splitting may occur when simulation islands become so large that maintaining simulation processing for the objects of the simulation island by a single computing node becomes difficult or impossible. By reducing the splitting of simulation islands, stability of simulations may be maintained while avoiding jitter. On the other hand, it is also important for the efficient parallelization of the simulation process to utilize multi-node architectures and process simulation islands in parallel, in particular when the simulation islands become large and splitting of simulation islands becomes a necessity.

In one embodiment, clusters of simulation islands may be formed and the formed clusters may be used to divide the simulated environment. Formation of clusters can refer to initial assignment of objects to nodes during initial allocation of objects to computing nodes. Formation of clusters can also refer to rearrangement and reassignment of objects during the course of simulation.

In an embodiment, the areas or volumes of a simulation island may be considered in the formation or splitting of clusters. By considering the areas and volumes and not just the clustering points, the splitting of simulation islands can be reduced. In other embodiments, various approaches to building clusters of nearby points and/or simulation islands may be employed.

In some embodiments, weights can be assigned to simulation islands to be used for the allocation of the simulation islands to nodes. For example, the weight of a simulation island can be determined by properties such as the spatial distribution, e.g., the number of objects, density of objects, or number of contacts (depending on the specific simulation). The clusters can then be built around the highest weighted simulation islands.

As used herein, the ownership of an object can include having control over the creation or destruction of an object, as well as final decisions regarding transfer of ownership of the object. Owners of an object may also have simulation authority over the object, the results of which may be sent to nodes to synchronize the state of the simulated object with replicas in the simulation scenario.

Although some examples of the disclosed subject matter are provided in the context of simulation of a three-dimensional simulated environment, such as a video game or interactive content, the principles can be applied to any type of simulation involving multiple nodes in a distributed environment, where simulation and other processing loads may dynamically change between nodes. For example, in the context of a large-scale multiplayer action video game, many objects may be part of a group of objects (also referred to as a simulation island) which may in turn move across computing node boundaries during the course of play, resulting in a significant amount of data that must transmitted between the computing nodes as simulation responsibility for the objects and characters are transferred between computing nodes for the simulation islands or as the simulation islands are split and passed to different computing nodes for simulation. Some examples of simulation islands may include objects in a moving vehicle, a school of fish, a group of migrating birds, or a group of clouds in a moving storm system. By managing and controlling the splitting of simulation islands to allow for increased efficiency of continued processing and minimization of delays that can lead to jitter, disruptions to the continued simulation of the video game may be avoided, thus improving the user experience.

Referring to FIG. 1, illustrated is an example multi-node implementation of a simulation scenario. Illustrated is a simulated three-dimensional world 110, which is divided into eight regions. Each of the eight regions may be assigned to one of eight nodes n1 through n8. In some examples, the nodes may be a computing device such as a server, as described in further detail below. Furthermore, in some examples the simulated three-dimensional world 110 may be divided based on three-dimensional space and geography. Each assigned node may be assigned ownership of objects within the respective assigned region. Initially, the assigned nodes may be assigned simulation authority for objects within the respective assigned regions.

Ownership may further be allocated using factors so that the processing load can be more evenly distributed between computing nodes. For example, ownership of objects may be distributed based on computing capacity of the computing nodes. In some examples, ownership may be allocated among computing nodes based on processing power, available memory capacity, and other computing attributes of nodes. Some computing nodes may have different configurations, resulting in different computing nodes having different capabilities for simulation processing. Additionally, it may be advantageous in some cases to keep simulation of objects of a particular type (e.g., weapons, vehicles, etc.) with one computing node. For example, objects associated with a particular group or objects that are known to interact frequently with other objects owned by the computing node may be assigned to the computing node for ownership.

Objects may also be initially assigned based on volume/density/number of objects in a region. In this way, for example, if one particular region has all of the objects, multiple nodes may be assigned that region and the remaining node or nodes may be assigned the other regions, since processing demand for regions with little to no objects may be less intensive. Furthermore, initial assignment may be based on anticipated or predicted object interaction, for example knowing that certain characters have a high probability of interacting with each other. In some scenarios the initial assignment may be determined as a function of the particular application and the expected distribution of processing tasks that may affect processing load in addition to the processing loads due to simulation of objects.

As the simulation of the simulated three-dimensional world 110 progresses, for example as a video game is played, objects may be caused to move from one region to another and interact with objects in other regions owned by other nodes. Furthermore, objects that need to be tracked by more than one node may be replicated and the movement of the replicated objects may be synchronized to maintain accuracy and fidelity of the simulation as a whole. Objects may include, for example, geographical terrain, rocks, trees, bodies of water, structures such as buildings and towers, animals, characters, projectiles, persons, fictional creatures, aircraft, spacecraft, and the like.

In one example of simulation authority of an object, a computing node that is performing simulation of an assigned region of a simulated universe as well as objects within the assigned region may track three groups of objects. The first group of objects may include objects for which the computing node has simulation authority. The computing node may perform simulation of these objects using a physics engine or other simulation engine, and may also send calculated simulation information to the other computing nodes so that the other nodes may track the movement of these simulated objects.

The second group of objects may include objects that the computing node is not currently simulating but is tracking. The computing node may track such objects to maintain awareness of actions occurring at the boundaries of the computing node's assigned region. In some embodiments, the computing node may maintain replicas to track objects in this second group. Replicas are copies of objects that may be tracked by a computing node. The computing node may receive updated information regarding the location and movement of the replicas from nodes that have simulation authority of the replicas.

The third group of objects may include objects that the computing node is not currently simulating and is tracking, but which is currently not being simulated by another computing node. Such objects may have been previously simulated by another computing node, but that computing node may have relinquished simulation authority for that object. A computing node may relinquish simulation authority for an object when simulation of the object is no longer needed. For example, an object may have come to rest and is no longer interacting with other objects, and therefore the object may not need to be actively simulated for at least a time. The computing node may continue to track replicas that are both being simulated or that are not being simulated in order to maintain awareness of these objects in the event that future motion of simulated objects result in an interaction with the replicas.

When motion of simulated objects results in an interaction with a replica that is not currently being simulated, the computing node may determine whether to assume simulation authority of the replica based on one or more of the criteria described above. For example, if the replica is at the boundary of the computing node's assigned region, and if the anticipated interaction with the object may result in movement of the replica into the computing node's assigned region, then the computing node may determine to assume simulation authority of the replica.

In another example, a replica that is actively being simulated by another computing node may move into the assigned region of the computing node. Based on one or more of the above criteria, the computing node may determine to assume simulation authority of the replica. For example, the computing node may determine that the replica will enter the assigned region of the computing node, and will further interact with other objects for which the computing node has simulation authority.

The disclosed examples illustrate implementation of changes in simulation authority, but the principles can also be applied to changes of ownership by the nodes.

In some examples, only one node may be allowed to have simulation authority of a given object in order to avoid conflicts and inconsistencies in the simulation. In some situations, simulation authority and other aspects of ownership for an object may be transferred from one node to another. For example, an object may have more interactions with objects assigned to a node other than the current node that has simulation authority.

Figure 2:
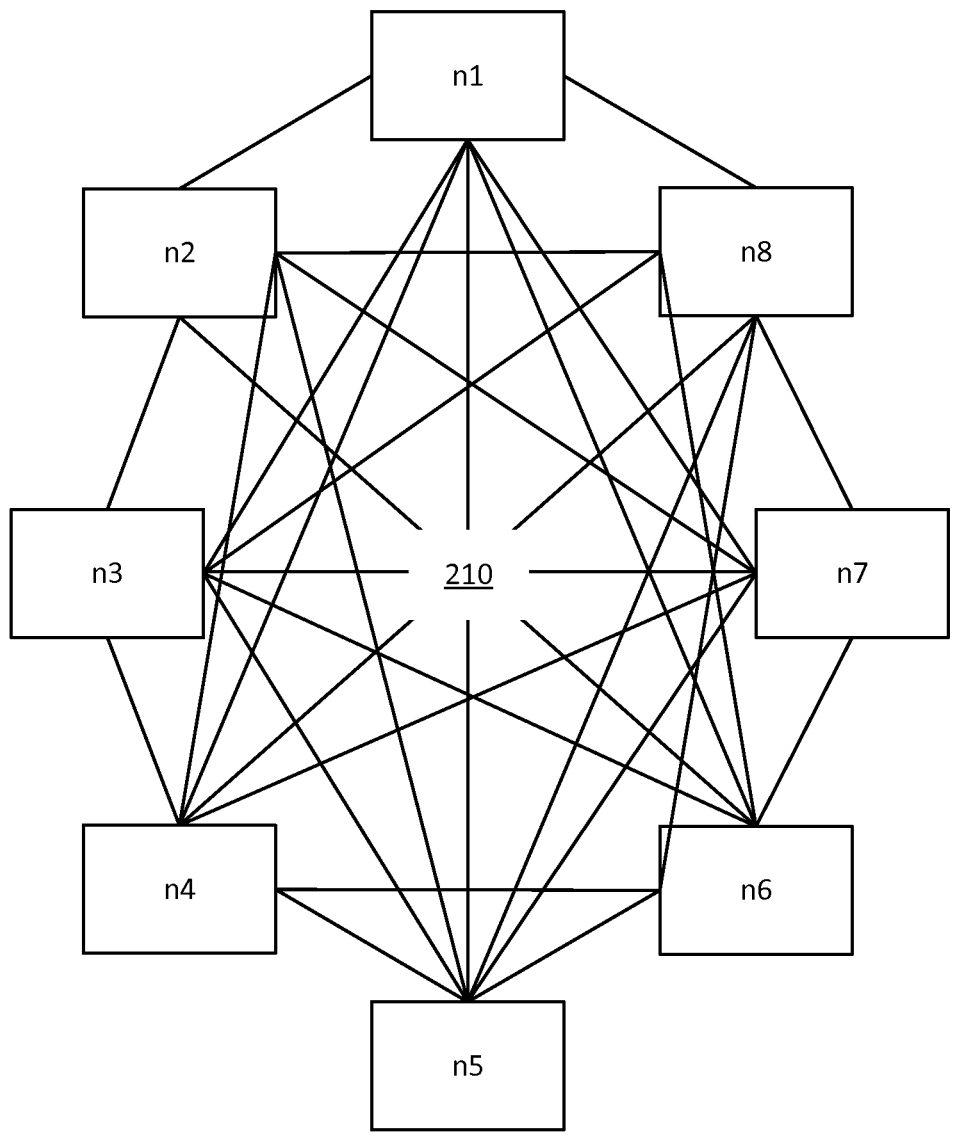
FIG. 2 is a diagram showing an example group of nodes that may be used in accordance with the present disclosure.

FIG. 2 illustrates a system of nodes n1 through n8 that are connected via a mesh network 210. The specific topology can vary, and the network 210 may include any number of routers and other network devices. The network 210 may include one or more wide area networks (WANs) such as the Internet and/or one or more local area networks (LANs). As mentioned, nodes n1 through n8 may be suitable computing devices such as servers having one or more processors and memory. Together, nodes n1 through n8 may form a multi-node computing environment that may execute applications that simulate various environments, such as in a multi-player video game. It should be appreciated that the network topology illustrated in FIG. 2 has been greatly simplified and that more networks and nodes may be utilized. These topologies and devices should be apparent to those skilled in the art. It should also be appreciated the example system described in FIG. 2 is merely illustrative and that other implementations might be utilized. Additionally, it should be appreciated that the functionality disclosed herein might be implemented in software, hardware or a combination of software and hardware. Other implementations should be apparent to those skilled in the art. It should also be appreciated that a server or other computing device may comprise any combination of hardware or software that can interact and perform the described types of functionality, including without limitation desktop or other computers, database servers, network storage devices and other network devices.

As mentioned, clustering algorithms may be used to analyze the simulated objects and determine how to split or merge groupings or simulation islands of objects. Clustering algorithms may generally be used for grouping objects into groups based on, for example, similarities between objects. Some embodiments may employ various clustering algorithms that can be used to group sets or clusters of simulated objects based on some measure of similarity, such as distance, density, or some statistical distribution. The specific clustering algorithm and parameters may be selected based on the simulation. The clustering algorithm may be changed during a simulation session or may be changed between sessions. The clustering algorithm may be used for splitting a simulation island, for example, into two simulation islands that are approximately equal in size. In one embodiment, k-means clustering may be used for cluster analysis. Other clustering algorithms such as hierarchical clustering, distribution-based clustering, density-based clustering, and shared-property clustering may be used, for example.

In K-means clustering, a user-specified number of clusters are determined that are represented by their prototypes or centroids. The centroid may be determined as the mean of a group of points, and may be applied to objects in a three-dimensional space. In one embodiment, a number K of a number of initial centroids may be chosen, where K is a user-specified parameter indicative of the number of desired clusters. Each object may be assigned to the closest centroid, and each grouping of objects assigned to a centroid may be defined as a cluster. The centroid of each cluster may then be updated based on the objects assigned to the cluster. These steps may be repeated until no more objects change clusters, or until the centroids remain the same. In an embodiment, the following algorithm may be implemented:

Select K points as initial centroids;
Form K clusters by assigning each point to its closest centroid;
Recompute the centroid of each cluster;
Repeat forming and recomputing steps until centroids do not change.

Initially, objects may be assigned to the initial centroids which are initially all in the entire group of objects. After objects are assigned to a centroid, the centroid may be updated. Next, objects may be assigned to the updated centroids, and the centroids may be updated.

In some embodiments, simulation islands may be represented by a bounding box, and characterized by the number of objects in the simulation island. Additionally, geometric parameters such as volume can be considered in the formation of simulation islands, and proportional measures such as the density can be used. Weights of simulation islands can be defined based on numbers of objects in a given volume or density. For example, a simulation island that has 50 objects in a volume of 100 square meters (as simulated) may be assigned a weight of 0.5, while a simulation island that has 25 objects in a volume of 100 square meters (as simulated) may be assigned a weight of 0.25.

Various thresholds can be selected and used to determine when to analyze loads and make a decision as to whether the allocation of objects should be changed. For example, a high threshold can be defined and selected to determine when objects assigned to a node should be split, and a low threshold can be defined and selected to determine when objects assigned to a node should be merged. In one embodiment, for example, a high threshold can be defined and selected as a percentage of processing capacity used for a node (e.g., 80%). Then, when the number of objects being simulated or processed by a particular node reaches 80%, that can signal or identify that objects, or at least a subset of the objects, in the simulation scenario should be reassigned. A clustering algorithm can be executed to determine new groupings by increasing the number of desired clusters. For example, if it is determined that a computing node has reached the high threshold and that the computing node has a single simulation island, then a K-means clustering algorithm may be applied with a desired K number of three to break the simulation island into three smaller groupings.

As another example, a low threshold can be defined and selected as a low percentage of processing load used for a node (e.g., 10%). Then, when the number of objects being simulated or processed by a particular node reaches 10%, that can signal or identify that objects, or at least a subset of the objects, in the simulation scenario should be reassigned. A clustering algorithm can be executed to determine new groupings by decreasing the number of desired clusters. For example, if it is determined that a computing node has reached the low threshold, then a clustering algorithm may be applied to simulation islands assigned to computing nodes surrounding the computing node with the low threshold. A K-means clustering algorithm may be executed with a lower K number in order to merge the number of simulation islands into smaller numbers of groupings.

In some embodiments, processing times for node outputs can be used instead of processing capacity. For example, the average processing time for a video frame output by a node can be used as a threshold, based on a minimum desired frame rate (e.g., minimum 35 ms/frame over the previous 10 seconds based on a desired frame rate of 30 frames/sec).

In some embodiments, a coordinator function may be implemented in one or more of the computing nodes. The coordinator function may be configured to determine the high and low thresholds, which may be changed during the course of execution of the application to account for different simulation scenarios.

When a high or low threshold has been reached, the clustering algorithm can be executed to identify clusters or simulation islands of simulated objects, and a load distribution function can be executed to determine how to reallocate the simulation islands. The load distribution function may operate to distribute simulation processing loads among multiple nodes of the system. Through the use of the load distribution function, greater utilization efficiency of available node processing capacity can be obtained during the course of execution of the application, during which the processing needs can continuously change as the simulated scenario changes. The load distribution function can also be configured to distribute simulation loads to achieve greater levels of fault tolerance. The load distribution function can also be configured to continuously monitor the health of the nodes, detect unhealthy nodes, and automatically reallocate resources to healthy nodes until the unhealthy nodes have been restored. In some embodiments, the load distribution function may be configured to automatically scale the overall processing capacity to meet the demands of the simulation scenario (e.g., add new nodes to the system if processing requirements increase). The load distribution function may be implemented in one or more of the nodes of the system.

The load distribution function may be configured to determine which clustering properties are relevant for a given simulation scenario. For example, an expected processing capacity factor can be estimated for a simulation scenario and a processing load sharing scheduling algorithm can be executed for the number of available computing nodes. The expected processing capacity factor can be adjusted based on a quality-of-service factor that may be selected based on the desired level of service that is to be provided to end users. In some embodiments, the load distribution function may implement a pattern classification engine to identify relevant parameters. For example, the load distribution function may include an expert learning system that may include a learning function to continuously learn which properties are relevant to a particular simulation scenario. For example, the learning system may utilize logical inferences based on the available information for a simulation scenario. The learning system may take information pertaining to actual processing times for past simulation scenarios and use the information as input to a rules-based system to generate updated processing event probabilities.

In some embodiments the clustering algorithm may be supplemented with a selection algorithm or an induction algorithm to define groups. Probabilistic approaches, such as Bayesian inferencing, may also be incorporated. Generally, some type of estimation may be incorporated, such as a parametric classification technique. In some embodiments, the load distribution function may employ probabilistic methods to guide and narrow the parameters that are used to group objects into clusters. Depending on the complexity of the simulation scenario, some situations may preclude a deterministic or exhaustive solution. In some embodiments a heuristic model can be used to find satisfactory solutions that provide an acceptable confidence level in the results. For example, experience-based techniques, such as expert modeling can be used to aid in the initial selection of objects.

The load distribution function may be further configured, using the various features described above, to make predictions regarding processing loads for the computing nodes. The predictions can be made based on current loads, expected simulation scenarios based on current simulation scenarios, expected interactions between objects, such as between characters and/or projectiles, and one or more prediction models. By using predictions, the load distribution function may anticipate processing loading issues and initiate analysis of objects and their movement, before thresholds are reached.

When it is determined that simulated objects should be moved from one node to another node for load redistribution, a procedure for transfer of ownership may be invoked. In some embodiments, the node that is to lose an object may initiate the process. In one embodiment, a broadcast message may be sent to the other nodes of the system to notify the nodes that a change of ownership is pending. The nodes that receive the broadcast message may wait to process any further information related to replicas of the pending object. For example, messages that are received from the current node that owns the pending object, as well as any other nodes regarding the pending object, may be placed in a message queue. The node that is to receive ownership of the pending object may then receive a copy of the pending object and synchronize current information for the pending object. Upon confirmation by the previous owner node that the change of ownership is acknowledged and completed, the new owner may broadcast a message to the other nodes indicating that the change in ownership for the pending object has been completed. Any queued messages regarding the pending object may then be processed, and some queued messages may be discarded as necessary.

Figure 3:
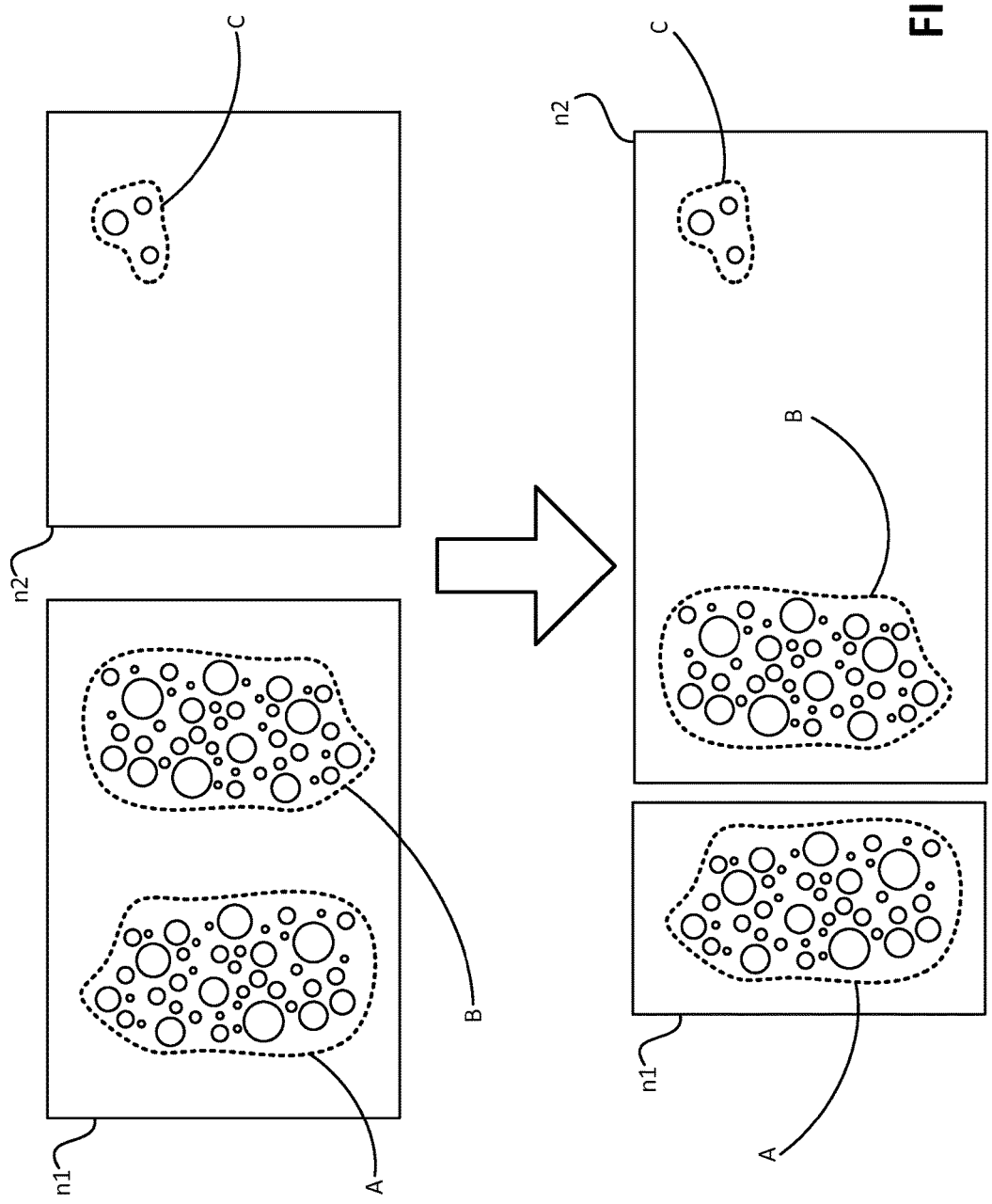
FIG. 3 is a diagram illustrating an example of changing object ownership.

FIG. 3 illustrates an example of the transfer of simulated objects between two nodes, in the case where the processing load of one or more nodes has reached a high threshold. In the example illustrated in FIG. 3, node n1 has ownership of simulated objects in group A and group B (which may not divided into groups initially). Node n2 has ownership of simulated objects in group C. A load distribution function may determine that the processing capacity of node n1 has exceeded a threshold value, and the load distribution function may be invoked to perform a clustering algorithm to determine ways to subdivide the objects owned by node n1. In this example, a high threshold may have been defined as a percentage of processing load used for node n1. It may be determined that node n1 has reached the high threshold, and that groups A and B should be reassigned. In another example, the average processing time for a video frame output by node n1 has reached a high threshold, such as based on a lower than desired frame rate. A clustering algorithm may be executed to determine new groupings that more evenly distribute the number of simulated objects between nodes n1 and n2. After executing the clustering algorithm, the load distribution function may determine that a number of the objects assigned to node n1 should be assigned to node n2. Furthermore, it may be determined that the objects of group B should be maintained in one simulation island. The load distribution function may thus determine that group B should be kept together and should be re-assigned from node n1 to node n2. After execution of the clustering algorithm, the objects may be grouped into group A and group B. The load distribution function may also determine that the number of objects owned by node n2 (shown as group C) represents a small processing load and that node n2 has reserve processing capacity to take on another group of objects from another node.

The load distribution function (or in some cases, node n1) may initiate the transfer of ownership of the objects in group B to node n2. After the transfer of ownership, node n1 is shown having ownership of the objects in group A, and node 2 is shown having ownership of the objects in group B. Node 2 may continue to retain ownership of the objects in group C.

Figure 4:
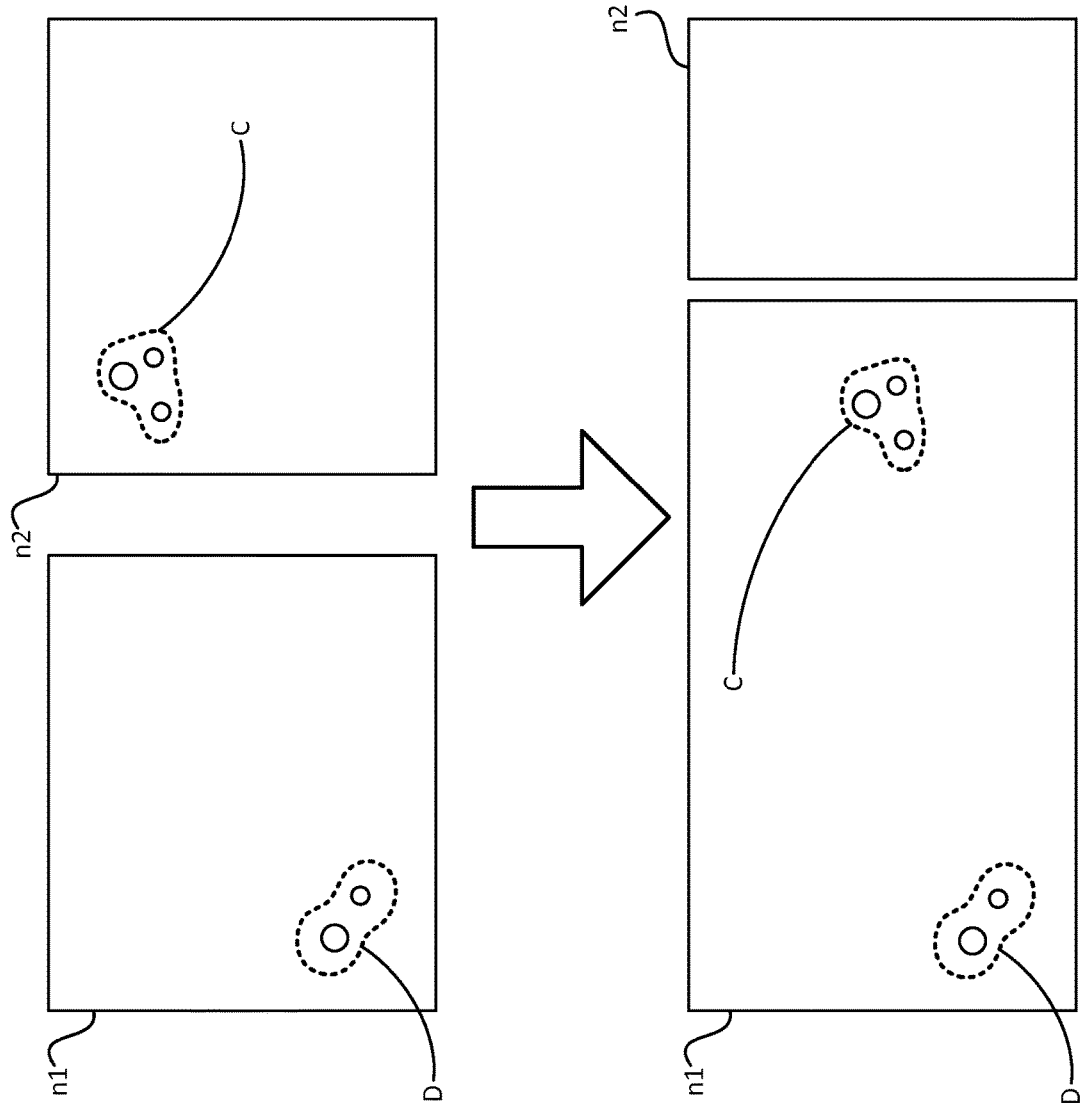
FIG. 4 is a diagram illustrating an example of changing object ownership.

In one embodiment, some criteria for determining a candidate node that can receive ownership of objects from an overloaded node may include:

1. the candidate node has ownership of at least one object that is interacting with an object in the group that is to be moved;

2. the candidate node has sufficient reserve computing capacity to perform simulation of the group of objects that is to be moved;

3. the candidate node claiming ownership has information about the group of objects that is to be moved; and 4. the candidate node has ownership of at least one object that is in spatial proximity with an object in the group that is to be moved;

FIG. 4 illustrates an example of the transfer of simulated objects between two nodes, in the case where the processing load of one or more nodes has reached a low threshold. In the example illustrated in FIG. 4, node n1 has ownership of simulated objects in group D. Node n2 has ownership of simulated objects in group C. A load distribution function may determine that the processing load of node n1 is below a threshold value, and the load distribution function may perform a clustering algorithm to determine ways to group the objects owned by node n1 with those of another node. In this example, a low threshold may have been defined as a percentage of processing load used for node n1. It may be determined that node n1 has reached the low threshold, and that groups A and B should be reassigned. In another example, the average processing time for a video frame output by node n1 has reached a low threshold, indicating that node n1 has capacity to take on more processing tasks. A clustering algorithm may be executed to determine new groupings for simulated objects in nodes n1 and n2. After executing the clustering algorithm, the load distribution function may determine that a number of the objects assigned to node n2 should be assigned to node n1. The load distribution function may thus determine that group C should be re-assigned from node n2 to node n1. After execution of the clustering algorithm, the clustering algorithm may determine that objects in group C and group D may be grouped together. The load distribution function may also determine that the number of objects owned by node n1 (shown as group D) represents a low computing load and that node n1 has reserve processing capacity to take on a group of objects from another node.

The load distribution function or node n1 may initiate the transfer of ownership of the objects in group C to node n1.

After the transfer of ownership, node n1 is shown having ownership of the objects in group C and group 2, and node 2 is shown as not having ownership of any objects. In this way, node 2 may be made available for assuming ownership of a larger simulation island than may have been possible before group C was removed from node 2.

In an example, during startup of a simulation session, the simulated environment (e.g., a geographic region or area) may be divided into regions which are allocated to the nodes of the multi-node system. The nodes may then take ownership of all objects within the allocated regions. The initial allocation may be adjusted in some cases for load distribution purposes. For example, a region with two large simulation islands may be further divided into two regions. The load distribution function may be executed as the simulation progresses, to continuously adjust allocation to maintain load distribution.

In some examples, an owner of an object may retain full control of an object, including its creation, destruction, simulation, and control over updates to the object. In the examples described in this disclosure, the owner may have the ability to generate the simulation parameters (e.g., position, orientation, linear and angular velocity) of an object that is synchronized with all replicas of the object. The owner may delegate some aspects of ownership as well as other controls pertaining to an object that is owned. In the examples described herein, the owner may delegate or relinquish some of its simulation authority of an owned object while retaining other controls over the object. Aspects of authority and ownership are provided in U.S. patent application Ser. No. 14/859,189, entitled "MULTI-NODE OBJECT SIMULATION," filed on Sep. 18, 2015, the entirety of which is hereby incorporated by reference.

In some simulation scenarios, a group of interacting objects may be referred to as a simulation island. A simulation island may be a group of actively simulated objects that are in contact with each other. For example, a simulation island can include a group of objects that interact with the simulated environment and each other and may remain in close proximity to each other, such as a group of characters and objects in a moving vehicle, a school of fish, a group of migrating birds, or a group of clouds in a moving storm system. In some examples, ownership of a simulation island may initially be assigned to a single node for computational efficiency. For example, when a simulation island is activated, simulation authority may be assigned to the node that activated the simulation island. When two simulation islands with ownership merge, the simulation islands may be evaluated to determine which node should assume ownership over the merged simulation islands. For example, the simulation islands may be scored based on a heuristic to determine which node should be assigned ownership. In some examples, ownership of an entire simulation island may be changed if there is no more simulation activity for any objects in the simulation island.

Figure 5:
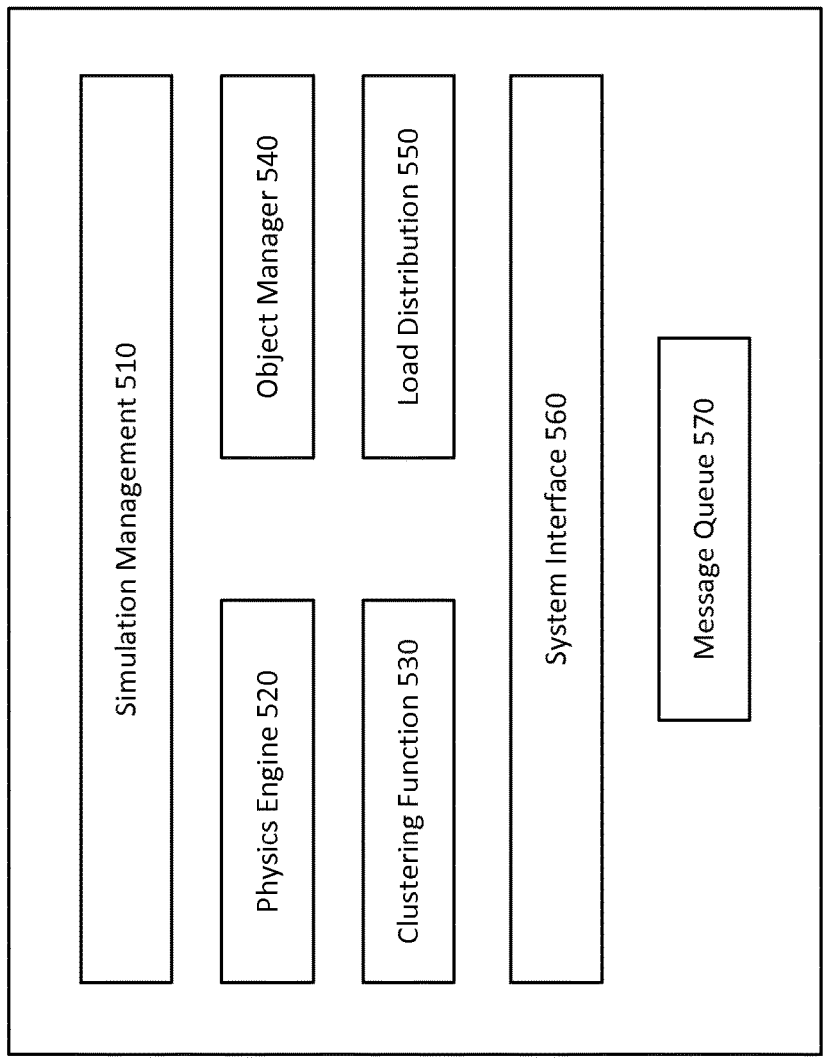
FIG. 5 is a diagram illustrating an example of functionality for simulation of objects in a multi-node environment that may be used in accordance with the present disclosure.

A diagram depicting example functionality for simulation of objects in a multi-node environment 500 that may be used in accordance with the present disclosure is shown in FIG. 5. In some examples, the depicted functionality may be implemented as software code executed by one or more nodes. As shown, functionality 500 for simulation of objects may include, for example, a simulation management function 510 that may be configured to monitor and manage the various processes and functions for owning and simulating objects in the simulation scenario. Functionality 500 for simulation of objects may also include a physics engine 520 configured to generate real-time simulation of objects including body dynamics and interactions with other objects. The physics engine 520 may be configured to simulate real world physics in multiple dimensions. The physics engine 520 may compute rigid body dynamics, soft body physics, and other dynamics depending on the application. In some examples, functionality 500 for simulation of objects may include a clustering function 530 for analyzing objects and, using a clustering algorithm, grouping objects based on input parameters and desired cluster characteristics.

Functionality 500 for simulation of objects may also include an object manager 540 configured to track and manage the various objects that are owned by the node as well as objects for which the node has replicas. Functionality 500 for simulation of objects may also include a load distribution function 550 configured to determine how to reallocate objects and distribute simulation processing loads among multiple nodes of the system. Functionality for simulation of objects 500 may also include system interface 560 configured to manage and coordinate communications with other nodes in the multi-node system. Messages for transmission or messages that have been received from other nodes may be queued in message queue 570 until they are processed. Additionally, in the case where the ownership of an object for which the node has a replica may be changed, messages pertaining to the replica may be placed in message queue 570. Upon confirmation by the owner node of a change in ownership of the replica, queued messages from the new owning node may then be processed. In cases where replicas are already in use by the node that becomes a new owner, some reduction in transmission and processing overhead may still be realized using the techniques described herein.

As should be appreciated, although only a single set of functionality 500 is shown in FIG. 5, multiple nodes may implement the depicted functionality, and the functionality may also be distributed over multiple nodes.

Figure 6:
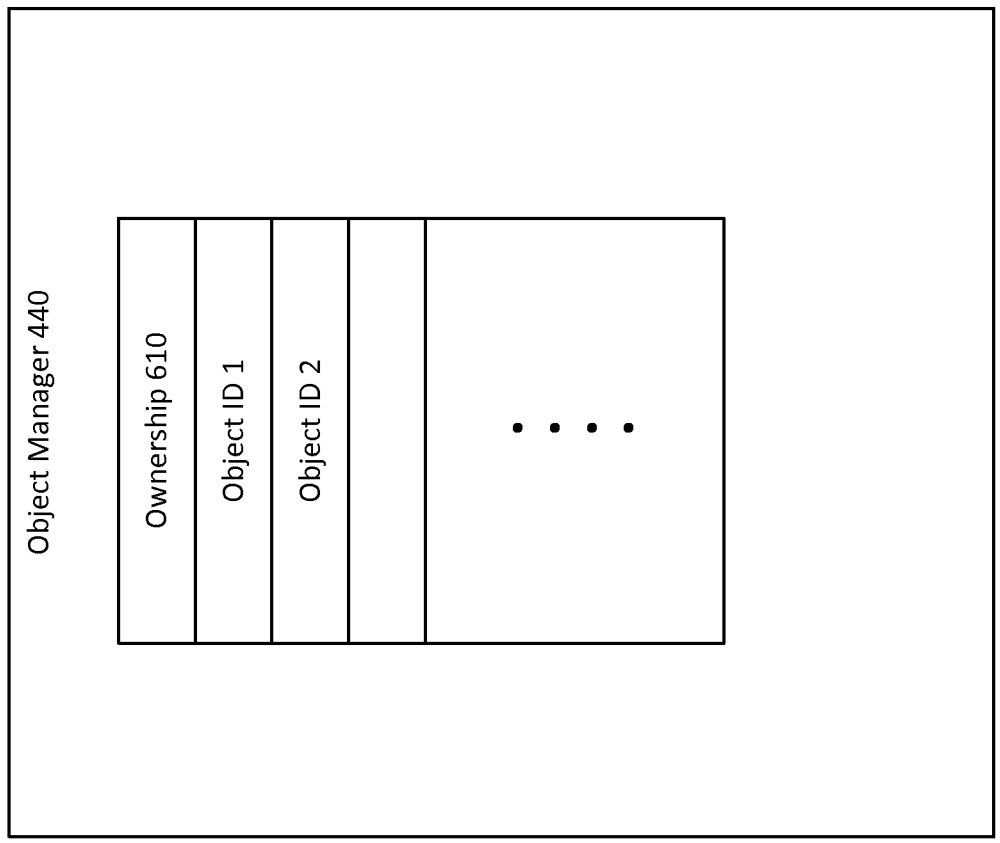
FIG. 6 is a diagram illustrating an example of an object manager used in simulation of objects in a multi-node environment in accordance with the present disclosure.

FIG. 6 depicts further details of the object manager 440 depicted in FIG. 4. Object manager 440 may include ownership records 610 that include object identifiers for objects that are owned by the node. It will be appreciated by one skilled in the art that the data structure shown in FIG. 6 may represent a data file, a database table, an object stored in a computer memory, a programmatic structure or any other data container commonly known in the art. Each data element included in the data structure may represent one or more fields in a data file, one or more columns of a database table, one or more attributes of an object, one or more member variables of a programmatic structure or any other unit of data of a data structure commonly known in the art.

Figure 7:
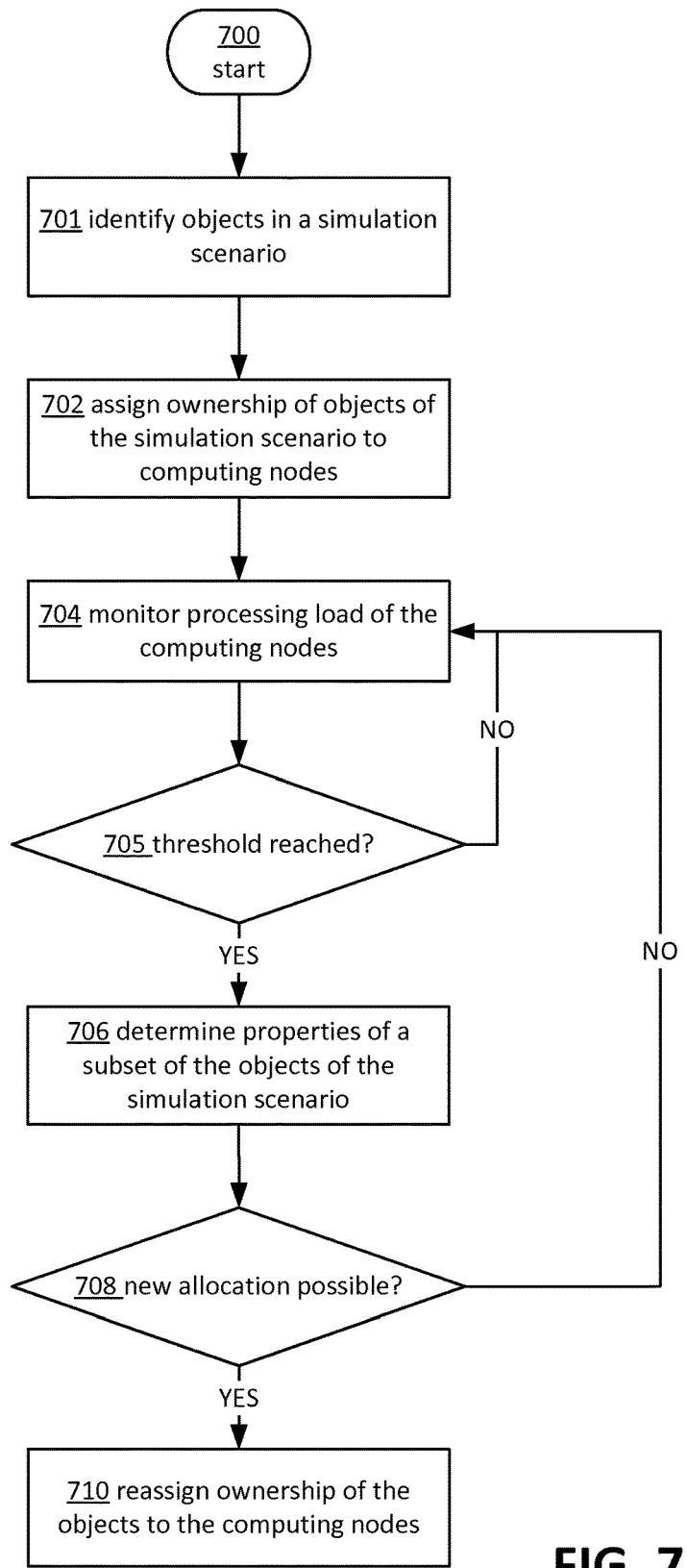
FIG. 7 is a diagram illustrating an example process for adaptive distribution of simulated objects in a multi-node environment that may be used in accordance with the present disclosure.
Figure 8:
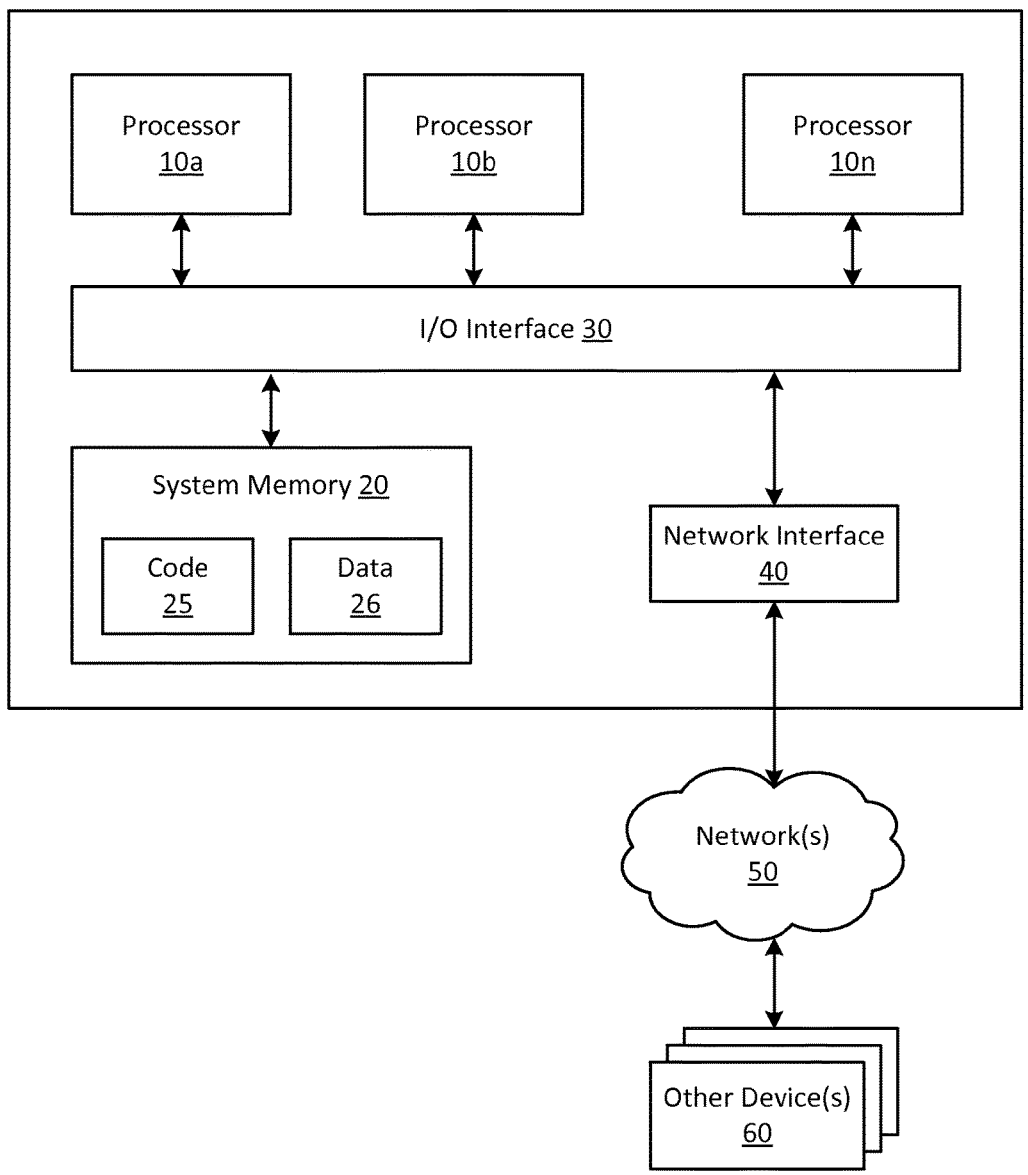
FIG. 8 is a diagram illustrating an example computing system that may be used in accordance with the present disclosure.

FIG. 7 illustrates an example operational procedure for adaptive distribution of simulated objects in a multi-node computing environment. In an embodiment, the operational procedure may be implemented in a system comprising one or more computing nodes in communication with each other. The computing nodes may have memories that have stored thereon computer-executable instructions that, when executed, cause the system to perform operations as described. In one embodiment, the system may comprise a computing node as depicted in FIG. 2. Referring to FIG. 8, operation 700 begins the operational procedure. Operation 700 may be followed by operation 701. Operation 701 illustrates identifying objects in a simulation scenario. The objects may include interacting objects that may be implemented across multiple computing nodes. The objects may include, for example, vehicles, projectiles, structures, and characters that may be created, destroyed, moved, and interact in a simulated environment.

Operation 701 may be followed by operation 702. Operation 702 illustrates assigning ownership of objects of a simulation scenario to the one or more computing nodes. The objects may be assigned based on factors such as the number of objects in a region of the simulation scenario, processing load for simulating the objects (e.g., processing load distribution associated with the simulation scenario), computing capacity of the computing nodes, and the spatial distribution of the objects. For example, a simulated three-dimensional world may be divided based on three-dimensional space and geography, and each of the plurality of nodes may be assigned ownership of objects within the respective assigned regions. In some examples, nodes may be assigned simulation authority for objects within the respective assigned regions. Additionally, objects that need to be tracked by more than one node may be replicated and the movement of the replicated objects may be synchronized. In further examples, the ownership of the objects is assigned to the plurality of nodes based at least in part on an object distribution scheme.

Operation 702 may be followed by operation 704. Operation 704 illustrates monitoring a processing load of the one or more computing nodes. For example, operation 404 may include monitoring processing loads associated with running the simulation scenario on the computing nodes during running of the simulation scenario. The processing load may be determined as a percentage of the maximum processing capacity of a computing node or a maximum video frame generation rate of a computing node, for example. The processing load may be based at least in part on, for example, the number of objects being simulated by particular computing nodes.

If a threshold value has been reached, then operation 704 may be followed by operation 706. Thresholds may be selected to determine when to analyze processing loads and determine whether to redistribute the allocation of objects to computing nodes. For example, a high threshold can be defined and selected to determine when objects assigned to a node should be split, and a low threshold can be defined and selected to determine when objects assigned to a node should be merged. The threshold value may comprise one of a maximum load and a minimum load. The threshold value may also comprise one of a maximum processing time and a minimum processing time. Operation 706 illustrates in response to the monitoring, determining one or more properties of a subset of the objects of the simulation scenario. The properties may be associated with interactions between objects of the subset. For example, the properties may be based on a measure of interaction between objects of the subset. The measure of interaction may indicate a potential for interaction between objects. In some embodiments, such a potential for interaction may be inferred based on the spatial distribution of objects. In some examples, the spatial distribution properties may include a number of objects and/or a density of the objects of the simulation scenario. A higher density of objects in a group may increase the probability that a given object in the group will interact with another object in the group. In some examples, the interactions between the subset of objects may identify simulation islands. A simulation island may be a group of simulated objects, where some or all of the group of simulated objects that are interacting with each other or have a high probability of interacting with each other. A simulation island may be characterized by properties such as the spatial distribution, e.g., the number of objects, density of objects, or number of contacts in the simulation island.

Operation 708 illustrates determining if a new allocation is possible. In some cases, a new allocation may be possible if, for example, at least one of the computing nodes are available for receiving additional allocations of the objects of the simulation scenario, such as when it is determined that at least one other computing node has not reached a threshold level. If a new allocation is possible and is determined to be necessary based on the properties, then operation 708 may be followed by operation 710. Operation 710 illustrates based at least in part on the one or more properties and the processing load, reassigning the ownership of the objects to the one or more computing nodes. In some examples, the reassigning step may be based at least in part on the one or more properties and the processing load of the plurality of computing nodes. For example, the reassigning step may include determining a level of interaction of the group of interacting objects. Additionally, the reassigning may include reallocating a group of objects to two or more nodes. Alternatively, the reassigning may comprise reallocating two groups of objects to one node. The reassigning may be based on spatial proximity of the objects.

In some examples, the determining step may be performed in response to determining that the processing load of at least one of the computing nodes has reached a threshold value. Additionally, the reassigning step may include clustering the objects to determine the subset.

In at least some embodiments, one or more nodes that implement a portion or all of one or more of the technologies described herein may include or may be associated with a computer system that includes or is configured to access one or more computer-accessible media. A node, which may be referred to also as a compute node or a computing node, may be implemented on a wide variety of computing environments, such as commodity-hardware computers, virtual machines, web services, computing clusters and computing appliances. Any of these computing devices or environments may, for convenience, be described as nodes. FIG. 8 depicts a computer system that includes or is configured to access one or more computer-accessible media. In the illustrated embodiment, computing device 15 includes one or more processors 10a, 10b and/or 10n (which may be referred herein singularly as "a processor 10" or in the plural as "the processors 10") coupled to a system memory 20 via an input/output (I/O) interface 30. Computing device 15 further includes a network interface 40 coupled to I/O interface 30.

In various embodiments, computing device 15 may be a uniprocessor system including one processor 10 or a multiprocessor system including several processors 10 (e.g., two, four, eight or another suitable number). Processors 10 may be any suitable processors capable of executing instructions. For example, in various embodiments, processors 10 may be embedded processors implementing any of a variety of instruction set architectures (ISAs), such as the x86, PowerPC, SPARC or MIPS ISAs or any other suitable ISA. In multiprocessor systems, each of processors 10 may commonly, but not necessarily, implement the same ISA.

System memory 20 may be configured to store instructions and data accessible by processor(s) 10. In various embodiments, system memory 20 may be implemented using any suitable memory technology, such as static random access memory (SRAM), synchronous dynamic RAM (SDRAM), nonvolatile/Flash®-type memory or any other type of memory. In the illustrated embodiment, program instructions and data implementing one or more desired functions, such as those methods, techniques and data described above, are shown stored within system memory 20 as code 25 and data 26.

In one embodiment, I/O interface 30 may be configured to coordinate I/O traffic between processor 10, system memory 20 and any peripherals in the device, including network interface 40 or other peripheral interfaces. In some embodiments, I/O interface 30 may perform any necessary protocol, timing or other data transformations to convert data signals from one component (e.g., system memory 20) into a format suitable for use by another component (e.g., processor 10). In some embodiments, I/O interface 30 may include support for devices attached through various types of peripheral buses, such as a variant of the Peripheral Component Interconnect (PCI) bus standard or the Universal Serial Bus (USB) standard, for example. In some embodiments, the function of I/O interface 30 may be split into two or more separate components, such as a north bridge and a south bridge, for example. Also, in some embodiments some or all of the functionality of I/O interface 30, such as an interface to system memory 20, may be incorporated directly into processor 10.

Network interface 40 may be configured to allow data to be exchanged between computing device 15 and other device or devices 60 attached to a network or networks 50, such as other computer systems or devices, for example. In various embodiments, network interface 40 may support communication via any suitable wired or wireless general data networks, such as types of Ethernet networks, for example. Additionally, network interface 40 may support communication via telecommunications/telephony networks, such as analog voice networks or digital fiber communications networks, via storage area networks such as Fibre Channel SANs (storage area networks) or via any other suitable type of network and/or protocol.

In some embodiments, system memory 20 may be one embodiment of a computer-accessible medium configured to store program instructions and data as described above for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media, such as magnetic or optical media—e.g., disk or DVD/CD coupled to computing device 15 via I/O interface 30. A non-transitory computer-accessible storage medium may also include any volatile or non-volatile media, such as RAM (e.g., SDRAM, DDR SDRAM, RDRAM, SRAM, etc.), ROM (read only memory) etc., that may be included in some embodiments of computing device 15 as system memory 20 or another type of memory. Further, a computer-accessible medium may include transmission media or signals such as electrical, electromagnetic or digital signals conveyed via a communication medium, such as a network and/or a wireless link, such as those that may be implemented via network interface 40. Portions or all of multiple computing devices, such as those illustrated in FIG. 8, may be used to implement the described functionality in various embodiments; for example, software components running on a variety of different devices and servers may collaborate to provide the functionality. In some embodiments, portions of the described functionality may be implemented using storage devices, network devices or special-purpose computer systems. The term "computing device," as used herein, refers to at least all these types of devices and is not limited to these types of devices.

Each of the processes, methods and algorithms described in the preceding sections may be embodied in, and fully or partially automated by, code modules executed by one or more computers or computer processors. The code modules may be stored on any type of non-transitory computer-readable medium or computer storage device, such as hard drives, solid state memory, optical disc and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. For example, elements may be added to, removed from or rearranged compared to the disclosed example embodiments.

It will also be appreciated that various items are illustrated as being stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Conditional language used herein, such as, among others, "can," "could," "might," "may," "e.g." and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having" and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some or all of the elements in the list.

While certain example embodiments have been described, these embodiments have been presented by way of example only and are not intended to limit the scope of the inventions disclosed herein. Thus, nothing in the foregoing description is intended to imply that any particular feature, characteristic, step, module or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed is:

1. A system, comprising:
one or more processors; and
one or more memories having stored thereon computer-executable instructions that, upon execution by the one or more processors, cause the system to perform operations comprising:
identifying objects in a simulation scenario;
assigning ownership of the objects to a first compute node;
determining that a processing load of the first compute node has reached a threshold value;
determining how many clusters of the objects are owned by the first compute node;
re-clustering the objects, wherein a second quantity of clusters is determined that exceeds a first quantity of one or more clusters owned by the first compute node;
forming the second quantity of clusters, wherein the forming the second quantity of clusters comprises using the second quantity as a selected quantity of cluster centroids for the second quantity of clusters; and
reassigning the ownership of the objects to a plurality of compute nodes including the first compute node and a second compute node, wherein the reassigning causes at least one cluster included in the second quantity of clusters to be owned by the second compute node.

2. The system of claim 1, wherein the clusters of the objects owned by the first compute node comprise simulation islands.

3. The system of claim 1, wherein the simulation scenario comprises a video game and the objects comprise characters, projectiles, vehicles, or structures.

4. The system of claim 1, wherein the forming the second quantity of clusters further comprises assigning the objects to the selected quantity of cluster centroids.

5. A method comprising:
assigning ownership of objects of a simulation scenario to a first compute node;
identifying that a processing load of the first compute node has reached a threshold;
determining how many clusters of the objects are owned by the first compute node;
re-clustering the objects, wherein a second quantity of clusters is determined that exceeds a first quantity of one or more clusters owned by the first compute node;
forming the second quantity of clusters, wherein the forming the second quantity of clusters comprises using the second quantity as a selected quantity of cluster centroids for the second quantity of clusters; and
reassigning the ownership of the objects to a plurality of compute nodes including the first compute node and a second compute node, wherein the reassigning causes at least one cluster included in the second quantity of clusters to be owned by the second compute node.

6. The method of claim 5, wherein the processing load comprises a percentage of a maximum processing capacity.

7. The method of claim 5, wherein the forming the second quantity of clusters is based at least in part on performance of a clustering algorithm.

8. The method of claim 5, wherein the reassigning is based at least in part on determining that other computing nodes have not reached a threshold level.

9. The method of claim 5, wherein the ownership of the objects are reassigned to the plurality of compute nodes based at least in part on spatial distribution of the objects in the simulation scenario.

10. The method of claim 7, wherein said clustering algorithm is configured to cluster the objects based on similarity between clustered objects.

11. The method of claim 5, wherein the simulation scenario comprises a video game and the objects comprise characters, projectiles, vehicles, or structures.

12. The method of claim 5, wherein the forming the second quantity of clusters further comprises assigning the objects to the selected quantity of cluster centroids.

13. A non-transitory computer-readable medium having stored thereon a set of instructions, which when performed by one or more processors, causes the one or more processors to perform operations comprising:
assigning ownership of objects of a simulation scenario to a first compute node;
identifying that a processing load of the first compute node has reached a threshold;
determining how many clusters of the objects are owned by the first compute node;
re-clustering the objects, wherein a second quantity of clusters is determined that exceeds a first quantity of one or more clusters owned by the first compute node;
forming the second quantity of clusters, wherein the forming the second quantity of clusters comprises using the second quantity as a selected quantity of cluster centroids for the second quantity of clusters; and
reassigning the ownership of the objects to a plurality of compute nodes including the first compute node and a second compute node, wherein the reassigning causes at least one cluster included in the second quantity of clusters to be owned by the second compute node.

14. The non-transitory computer-readable medium of claim 13, wherein the processing load comprises a percentage of a maximum processing capacity.

15. The non-transitory computer-readable medium of claim 13, wherein the reassigning is based at least in part on performance of a clustering algorithm.

16. The non-transitory computer-readable medium of claim 13, wherein the forming the second quantity of clusters is based at least in part on determining that other compute nodes have not reached a threshold level.

17. The non-transitory computer-readable medium of claim 13, wherein the ownership of the objects are assigned to the plurality of compute nodes based at least in part on spatial distribution of the objects in the simulation scenario.

18. The non-transitory computer-readable medium of claim 15, wherein said clustering algorithm is configured to cluster the objects based on similarity between clustered objects.

19. The non-transitory computer-readable medium of claim 13, wherein the simulation scenario comprises a video game and the objects comprise characters, projectiles, vehicles, or structures.

20. The non-transitory computer-readable medium of claim 13, wherein the forming the second quantity of clusters further comprises assigning the objects to the selected quantity of cluster centroids.

* * * * *